United States Patent
Chen et al.

(10) Patent No.: US 9,608,022 B2
(45) Date of Patent: Mar. 28, 2017

(54) COLOR FILTER ARRAY AND IMAGE RECEIVING METHOD THEREOF

(71) Applicant: NOVATEK Microelectronics Corp., Hsin-Chu (TW)

(72) Inventors: I-Hsiu Chen, Taipei (TW); Shu-Fang Wang, Hsinchu (TW); Po-Jen Hsiao, New Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 198 days.

(21) Appl. No.: 14/551,100

(22) Filed: Nov. 24, 2014

(65) Prior Publication Data

US 2016/0064434 A1  Mar. 3, 2016

(30) Foreign Application Priority Data

Sep. 3, 2014 (TW) .............................. 103130491 A

(51) Int. Cl.

| | |
|---|---|
| *G01J 3/50* | (2006.01) |
| *H01L 27/146* | (2006.01) |
| *H04N 5/33* | (2006.01) |
| *G02B 5/20* | (2006.01) |
| *H04N 9/07* | (2006.01) |

(52) U.S. Cl.
CPC ........ *H01L 27/14621* (2013.01); *G02B 5/201* (2013.01); *H04N 5/332* (2013.01); *H04N 9/07* (2013.01); *G02B 5/208* (2013.01)

(58) Field of Classification Search
CPC ................................................ H01L 27/14621

USPC ........................................................ 250/226
See application file for complete search history.

(56) References Cited

U.S. PATENT DOCUMENTS

| | | | |
|---|---|---|---|
| 6,211,521 B1 * | 4/2001 | Bawolek | G02B 5/201 250/208.1 |
| 8,446,470 B2 | 5/2013 | Lu | |
| 2010/0295947 A1 | 11/2010 | Boulanger | |
| 2014/0124797 A1 * | 5/2014 | Jones | G01S 17/026 257/80 |
| 2015/0381957 A1 * | 12/2015 | Lim | H04N 9/04 348/224.1 |

FOREIGN PATENT DOCUMENTS

| | | |
|---|---|---|
| TW | 201036186 | 10/2010 |
| TW | 201332352 | 8/2013 |

* cited by examiner

*Primary Examiner* — Thanh Luu

(74) *Attorney, Agent, or Firm* — Winston Hsu; Scott Margo

(57) ABSTRACT

A color filter array, for an image sensing device, includes a plurality of filter patterns. Each filter pattern includes at least one first filter, corresponding to a first wavelength range of a first color; at least one second filter, corresponding to a second wavelength range of a second color; at least one third filter, corresponding to a third wavelength range of a third color; at least one fourth filter, corresponding to a first infrared wavelength range, wherein the first infrared wavelength range is an intersection of the first wavelength range and the second wavelength range; and at least one fifth filter, corresponding to a second infrared wavelength range, wherein the second infrared wavelength range is an intersection of the first wavelength range and the third wavelength range.

10 Claims, 9 Drawing Sheets

_US 9,608,022 B2_

COLOR FILTER ARRAY AND IMAGE RECEIVING METHOD THEREOF

BACKGROUND OF THE INVENTION

1. Field of the Invention

The present relates to a color filter array and image receiving method thereof, and more particularly, to a color filter array capable of simultaneously sensing infrared and invisible light and image receiving method thereof.

2. Description of the Prior Art

Image sensor is widely utilized in consumer electronic products, such as scanners, digital cameras, mobile phones and personal digital assistants. The most common types of image sensing device are Complementary Metal Oxide Semiconductors (CMOS) and Charge Coupled Device (CCD). Generally, the image sensor requires color filters to sense visible light information of specific colors, such as red, blue and green. However, the color filters cannot filter out infrared and the color of an image would be distorted if the image sensor receives the infrared information. Therefore, a conventional image sensor generally requires an additional infrared cut filter to filter out the infrared and to acquire the accurate color information.

When the image sensor is in an environment with insufficient light, the image sensor equipped the infrared cut filter may not acquire clear images. In order to capture the clearer images, the image sensor needs to temporally remove (e.g. move away) the infrared cut filter and turn on an infrared light source (e.g. an infrared light-emitting diode (LED)), to increase the intensity of the signals sensed by the image sensor. In such a condition, the color information of the image received by the image sensor would be distorted. In other words, the image sensor utilizes the infrared cut filter to acquire the correct color information when the intensity of the environment light is sufficient; and removes the infrared cut filter for acquiring the clear images when the environment light is insufficient. As can be seen from the above, the conventional image sensor requires the infrared cut filter and the components for moving the infrared cut filter, which results in that the manufacture cost of the image sensor increases. Thus, how to take the image quality and the color information into account without increasing the manufacture cost becomes a topic to be discussed in the industry.

SUMMARY OF THE INVENTION

In order to solve the above problem, the present invention provides a color filter array simultaneously detecting infrared and visible light and image receiving method thereof.

As an aspect, the present invention discloses a color filter array, for an image sensing device, the color filter array comprising a plurality of filter patterns and each filter pattern comprises at least one first filter, corresponding to a first wavelength range of a first color; at least one second filter, corresponding to a second wavelength range of a second color; at least one third filter, corresponding to a third wavelength range of a third color; at least one fourth filter, corresponding to a first infrared wavelength range, wherein the first infrared wavelength range is an intersection of the first wavelength range and the second wavelength range; and at least one fifth filter, corresponding to a second infrared wavelength range, wherein the second infrared wavelength range is an intersection of the first wavelength range and the third wavelength range.

As another aspect, the present invention discloses an image receiving method, for an image sensing device, the image receiving method comprising receiving first image data of a first wavelength range corresponding to a first color; receiving second image data of a second wavelength range corresponding to a second color; receiving third image data of a third wavelength range corresponding to a third color; receiving fourth image data of a first infrared range, wherein the first infrared range is an intersection of the first wavelength range and the second wavelength range; and adjusting the second image data according to the fourth image data.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
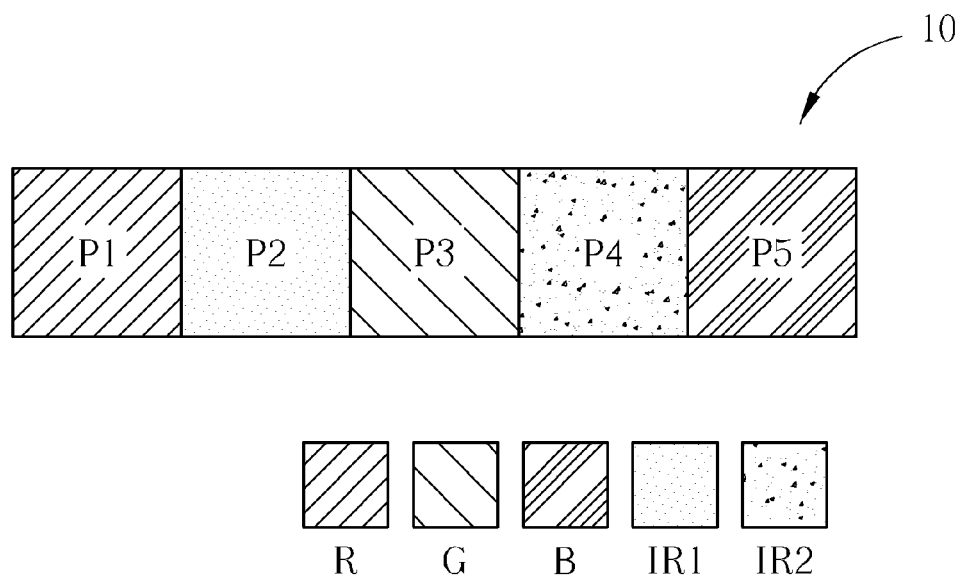
FIG. 1A is a schematic diagram of a filter pattern according to an embodiment of the present invention.

Please refer to FIG. 1A, which is a filter pattern 10 according to an embodiment of the present invention. The filter pattern 10 may be utilized in an image sensing device or an electronic products equipping with the function of image sensing (e.g. a digital camera). Via repeatedly arranging the filter pattern 10, a color filter array of the image sensing device can be acquired. The image sensing device therefore can acquire image data with color information via the color filter array. As shown in FIG. 1A, the filter pattern 10 comprises pixels P1-P5 which are corresponding to red R, infrared IR1, green G, infrared IR2 and blue B, respectively. That is, the pixels P1-P5 are utilized for receiving light of different wavelength ranges. Via the color filter array consisted of the filter patterns 10, the image sensing device acquires intensity information of 5 different wavelength ranges, simultaneously In such a condition, the image sensing device does not need additional infrared cut filter to filter out the infrared element in the received intensity information and the color information in the image data received by the image sensing device can be closer to the true colors.

Figure 1B:
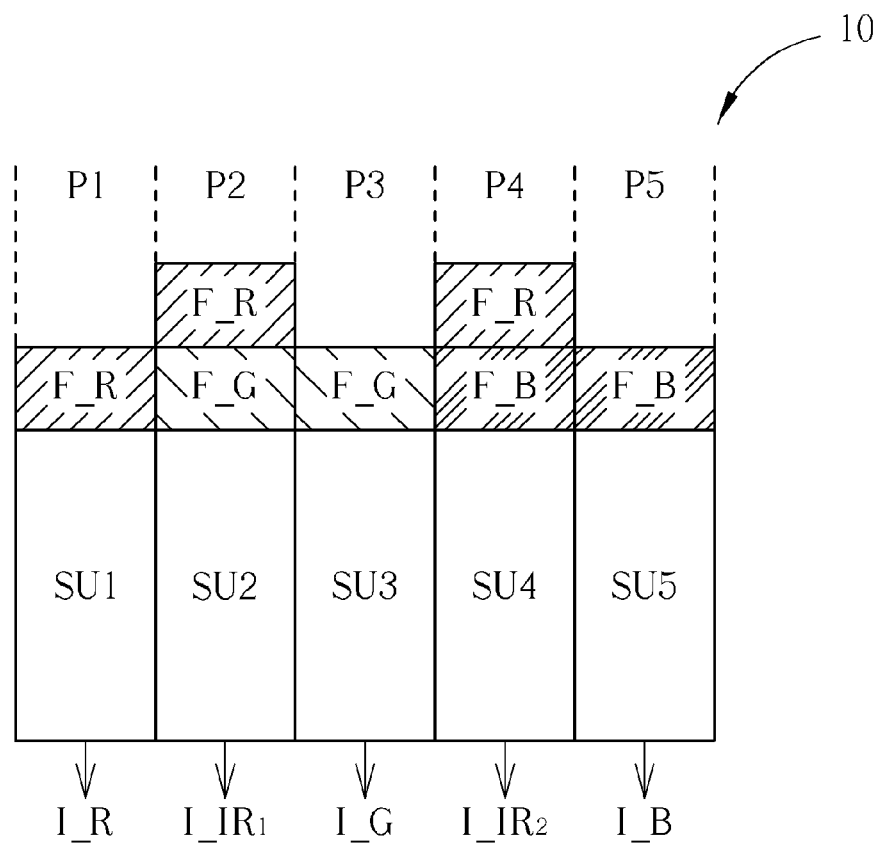
FIG. 1B is a cross-section of the filter pattern shown in FIG. 1A.

Please refer to FIG. 1B, which is a cross-section of the filter pattern 10 shown in FIG. 1A. For simplify instructions, FIG. 1B shows a red filter F_R, a green filter F_G, a blue filter F_B and sensing units SU1-SU5 and the components which do not directly relate to the concept of the present invention (e.g. lens, a control circuit and an computing circuit) are omitted. As shown in FIG. 1B, the pixel P1 comprises a red filter F_R and the sensing unit SU1. When the external light passes through the red filter F_R, only the light of a wavelength range W_R corresponding to the red light emits to the sensing unit SU1. The sensing unit SU1 therefore detects and acquires intensity information I_R of the red light. Similarly, the pixel P3 comprises the green filter F_G and the sensing unit SU3. When the external light passes through the green filter F_G, only the light of a wavelength range W_G corresponding to the green light emits to the sensing unit SU3. The sensing unit SU3 detects and acquires intensity information I_G of the green light. The pixel P5 comprises the blue filter F_B and the sensing unit SU5. When the external light passes through the blue filter F_B, only the light of a wavelength range W_B corresponding to the blue light emits to the sensing unit SU5. The sensing unit SU5 detects and acquires intensity information I_B of the blue light. Note that, since the red filter F_R, the green filter F_G and the blue filter F_B cannot effectively filter out light of the infrared wavelength range, the intensity information I_R, I_G and I_B comprise the intensity information of the infrared. In other words, all of the wavelength ranges W_R, W_G and W_B comprise an infrared wave length range W_IR.

In FIG. 1B, the pixel P2 comprises the red filter F_R, the green filter F_G and the sensing unit SU2, wherein the red filter F_R is formed on the green filter F_G. When the external light passes through the red filter F_R and the green filter F_G, the light of an infrared wavelength range W_IR1 emits to the sensing unit SU2, wherein the infrared wavelength range W_IR1 is an intersection of the wavelength ranges W_R and W_G. The sensing unit SU2 detects and acquires intensity information I_IR1 of the infrared wavelength range W_IR1. That is, the pixel P2 is utilized for receiving the light in an intersection of the wavelength ranges W_R and W_G. Similarly, the pixel P4 comprises the red filter F_R, the blue filter F_B and the sensing unit SU4, wherein the red filter F_R is formed on the blue filter F_B. When the external light passes through the red filter F_R and the blue filter F_B, the light of an infrared wavelength range W_IR2 emits to the sensing unit SU4, wherein the infrared wavelength range W_IR2 is an intersection of the wavelength ranges W_R and W_B. The sensing unit SU5 detects and acquires intensity information I_IR2 of the infrared wavelength range W_IR2. In other words, the pixel P4 is utilized for receiving the light in the intersection of the wavelength ranges W_R and W_G.

After respectively acquiring the intensity information I_R, I_G, I_B, I_IR1 and I_IR2, the image sensing device removes the infrared elements in the intensity information I_R, I_G and I_B according to the intensity information I_IR1 and I_IR2. For example, since the wavelength range W_IR1 corresponding to the intensity information I_IR1 is the intersection of the wavelength range W_R of the red light and the wavelength range W_G of the green light, the intensity information IR1 is provided with the infrared intensity information in the intensity information I_G. If the image sensing device subtracts the intensity information I_IR1 from the intensity information I_G, the infrared intensity information in the intensity information I_G is removed and the accurate color information can be acquired. Similarly, if the image sensing device subtracts the intensity information I_IR2 from the intensity information I_B and I_R, the infrared intensity information of the intensity information I_B and I_R is removed and the accurate color information can be also acquired. In other words, via the filter pattern 10, the image sensing device acquires the accurate color information without using the infrared cut filters.

Note that, the goal of removing the infrared intensity information from the intensity information I_R can be also achieved by subtracting the infrared information I_IR1 from the intensity information I_R.

Figure 2A:
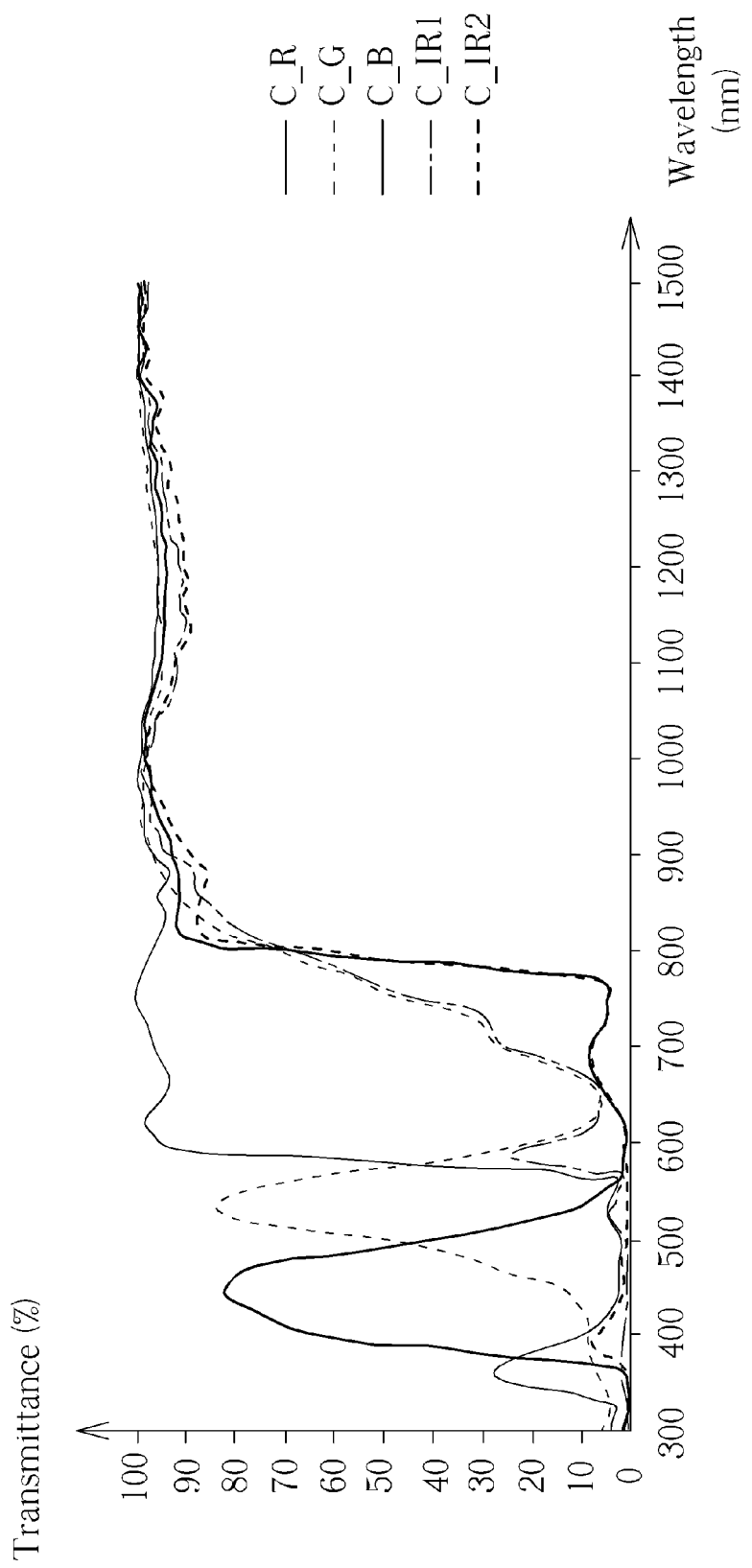
FIG. 2A is a schematic diagram of relationships between the transmittance of the filter pattern shown in FIG. 1B and wavelength.

Please refer to FIG. 2A, which is a schematic diagram of relationships between the transmittance of the filter pattern 10 shown in FIG. 1B and the wavelength. FIG. 2A shows curves C_R, C_IR1, C_G, C_IR2 and C_B which are respectively corresponding to the pixels P1-P5. As shown in FIG. 2A, the curve C_R equips with greater transmittance when the wavelength of light enters the wavelength range of the red light (i.e. from 600 nanometer (nm) to 700 nm). Similarly, the curve C_G equips with greater transmittance when the wavelength of light is within the range from 500 nm to 570 nm and the curve C_B equips with greater transmittance when the wavelength of light is within the range from 400 nm to 500 nm. In this embodiment, the curves C_R, C_G and C_B equip great transmittance when the wavelength of light exceeds 800 nm (i.e. enters the infrared wavelength range) since the red filter I_R, the green filter I_G and the blue filter F_B cannot effectively filter out the light of the infrared wavelength range.

On the other hand, the curve C_IR1 approximates an intersection of the curves C_R and C_G since the light emitted to the sensing unit SU2 passes through the red filter F_R and the green filter F_G. In addition, the curve C_IR2 approximates an intersection of the curves C_R and C_B since the light emitted to the sensing unit SU4 passes through the red filter F_R and the blue filter F_B.

Figure 2B:
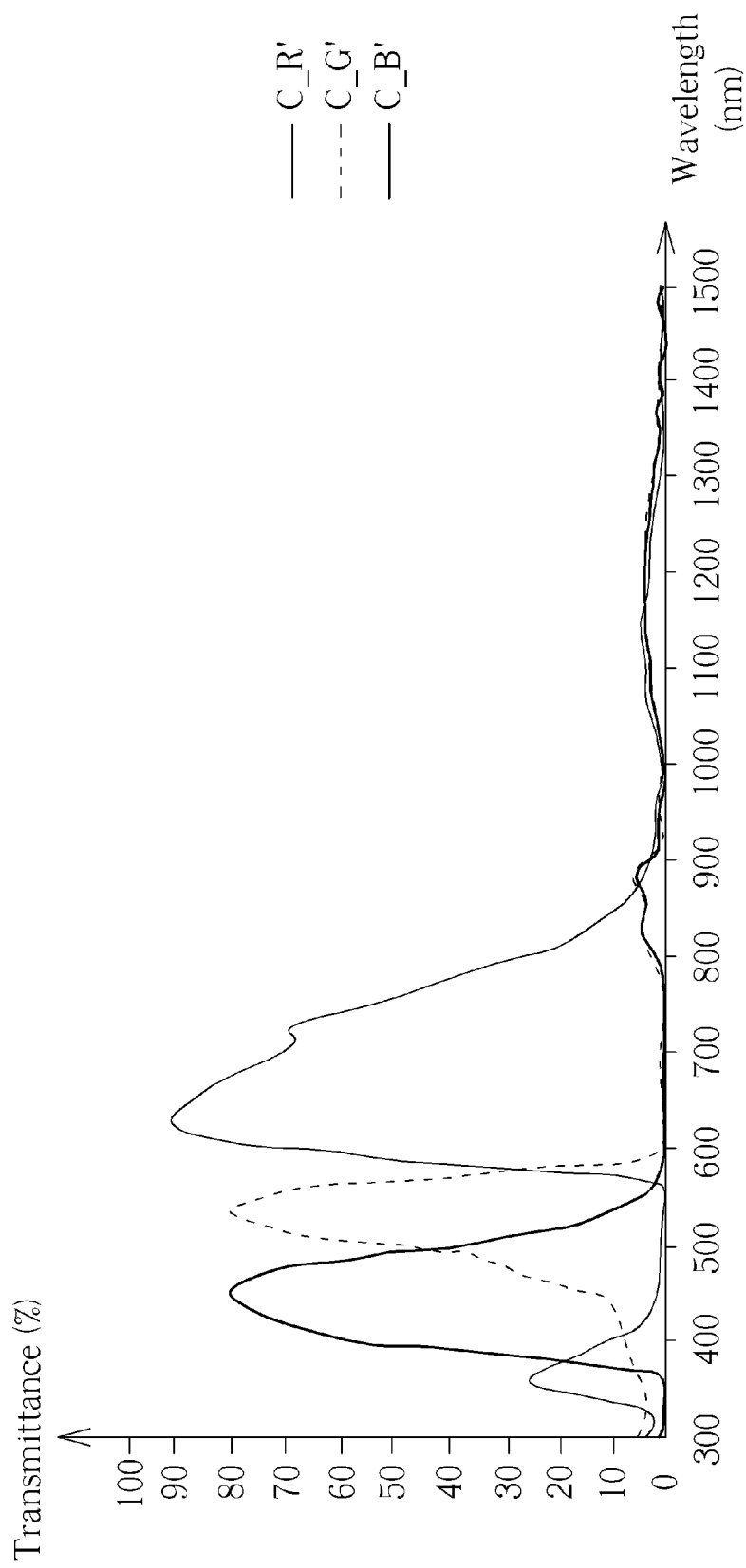
FIG. 2B is a schematic diagram of relationships between the transmittances and wavelength according to an embodiment of the present invention.

Please refer to FIG. 2B, which is a schematic diagram of relationships between the transmittance and the wavelength according to an embodiment of the present invention. Curves C_R', C_G' and C_B' are depicted in FIG. 2B, wherein the curve C_R' is a difference between the curves C_R and C_IR1 (i.e. C_R'=C_R−C_IR1), the curve C_G' is a difference between the curves C_G and C_IR1 (i.e. C_G'=C_G−C_IR1) and the curve C_B' is a difference between the curves C_B and C_IR2 (i.e. C_B'=C_B−C_IR2). Since the curve C_IR1 approximates the intersection of the curves C_R and C_G, the transmittance of the curves C_G' approximates to 0 after the light wavelength exceeds 600 nm. Similarly, the transmittance of the curves C_B' approximates to 0 after the light wavelength exceeds 600 nm after subtracting the curve C_IR2 and the transmittance of the curves C_G' approximates to 0 after the light wavelength exceeds 900 nm after subtracting the curve C_IR1. In other words, the image sensing device removes the infrared intensity information in the intensity information I_R, I_G and I_B via subtracting the intensity information I_IR1 from the intensity information I_R and I_G and subtracting the intensity information I_IR2 from the intensity information I_B, so as to acquire the accurate color information. As a result, the image sensing device achieves the goal of removing the infrared intensity information without using the infrared cut filter.

The above embodiments detect the intensity information of different wavelength ranges and allow the image sensing device to acquire the accurate color information without using the infrared cut filter. According to different applications and design concepts, those with ordinary skill in the art may observe appropriate modifications and alternations. Please to refer to FIG. 1B, the red filters F_R in the pixels P2 and P4 may be replaced by an infrared filter F_IR which filters out the light outside the wavelength range W_IR of the infrared. For example, the wavelength range W_IR may be from 700 nm to 1400 nm. In such a condition, the sensing unit SU2 only receives the light within an intersection of the wavelength ranges W_G and W_IR and the sensing unit SU4 only receiving the light within an intersection of the wavelength ranges W_B and W_IR.

Figure 3:
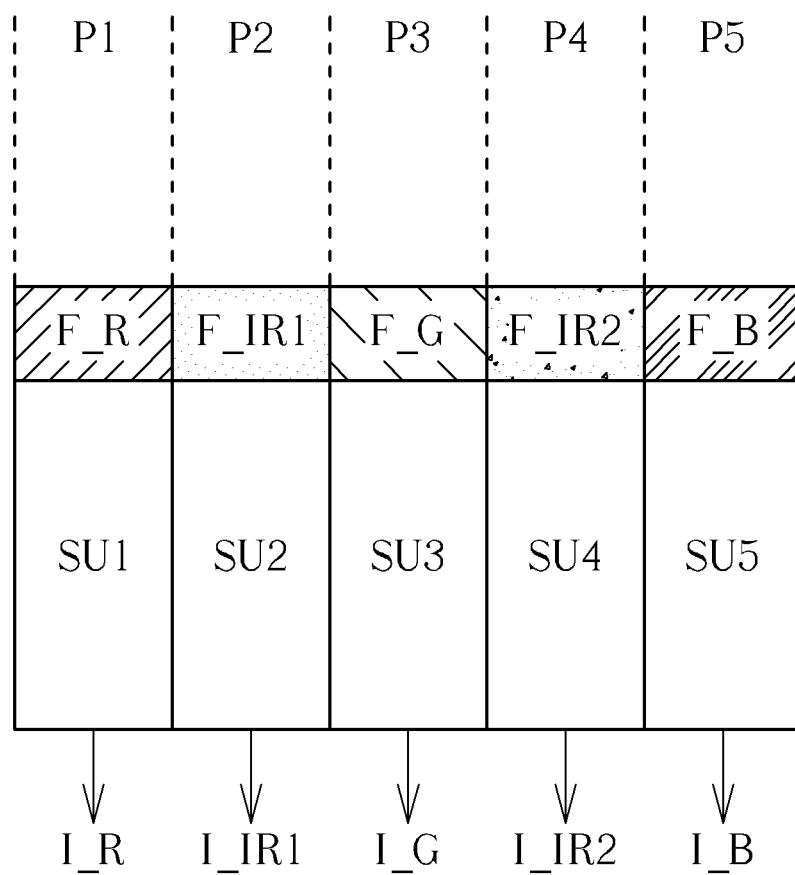
FIG. 3 is another cross section of the filter pattern shown in FIG. 1A.

Please refer to FIG. 3, which is another cross-section of the filter pattern 10 shown in FIG. 1A. The filter pattern 10 shown in FIG. 3 is similar to that shown in FIG. 1B, thus the components and signals with similar functions use the same symbols. Different from FIG. 1B, the pixel P2 only comprises a red-green filter F_RG, which filters out the light outside an intersection of the wavelength ranges W_R and W_G. In addition, the pixel P4 is modified to equip a red-blue filter F_RB, which filters out the light outside an intersection of the wavelength ranges W_R and W_B. Via the filter pattern 10 shown in FIG. 3, the image sensing device detects the intensity information of 5 different wavelength ranges. The image sensing device can eliminate the infrared elements in the received intensity information without using the additional infrared cut filter and the color information of the image captured by the image sensing device can be closer to the true colors, therefore.

Figure 4A:
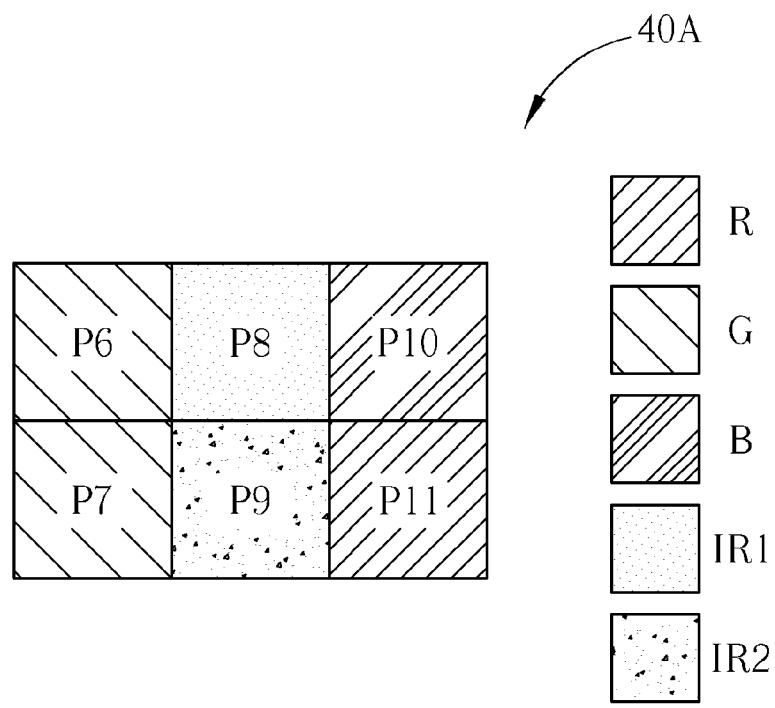
FIGS. 4A-4F are schematic diagrams of filter patterns according to embodiments of the present invention.
Figure 4B:
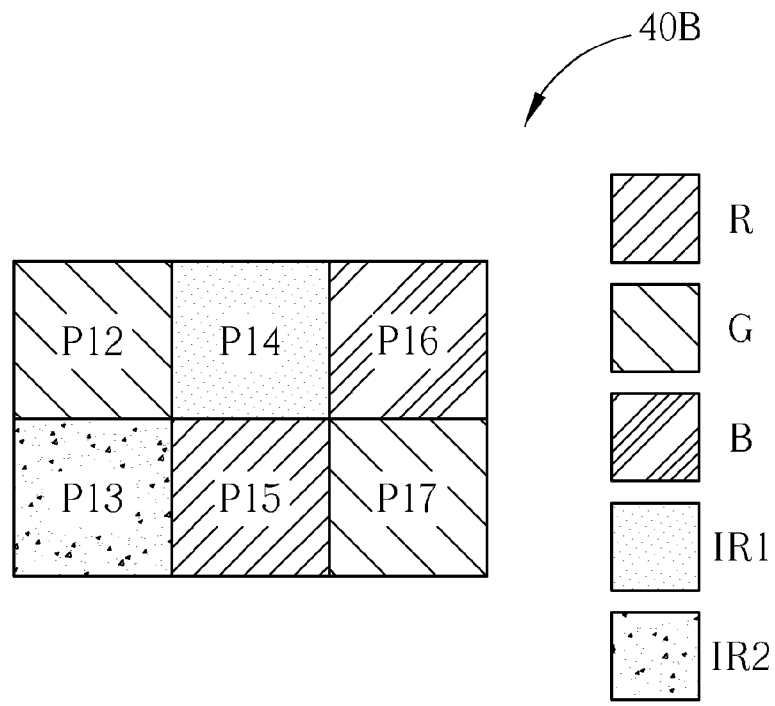

According to different applications and design concepts, the arranging method of the pixels corresponding to different wavelength ranges may be appropriately changed and is not limited by that shown in FIG. 1A. Please refer to FIGS. 4A-4F, which are schematic diagrams of filter patterns according to embodiments of the present invention. The filter patterns shown in FIGS. 4A-4F may be utilized in an image sensing device or an electronic product equipping the function of image sensing (e.g. a digital camera). The color filter array of the image sensing device can be implemented via repeatedly arranging the filter patterns shown in FIGS. 4A-4F and the image sensing device therefore can acquire the image data with the color information. As shown in FIG. 4A, the filter patterns 40A comprises pixels P6-P11 and pixels P6-P11 are corresponding to the green G, the green G, the infrared IR1, the infrared IR2, the blue B and the red R, respectively. On the other hand, the filter pattern 40B shown in FIG. 4B comprises pixels P12-P17, and the pixels P12-P17 are corresponding to the green G, the infrared IR2, the infrared IR1, the red R, the blue B and the green G, respectively.

Figure 4C:
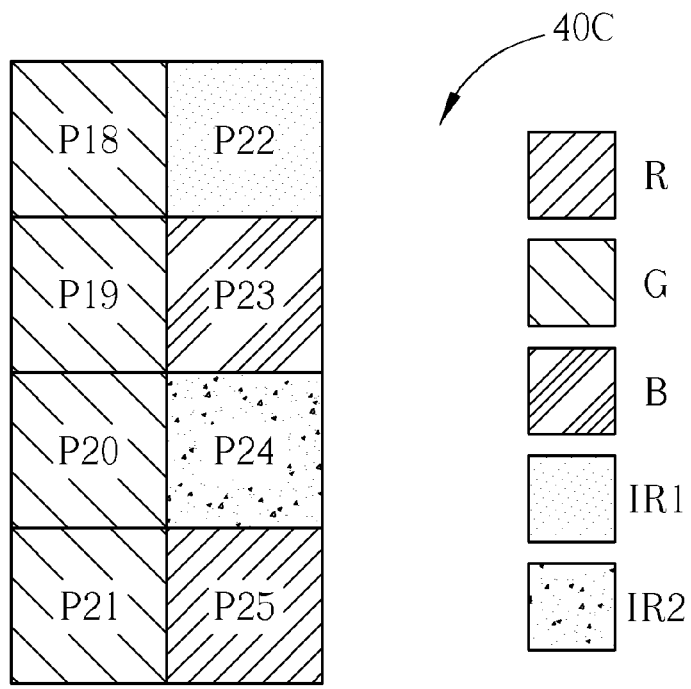
Figure 4D:
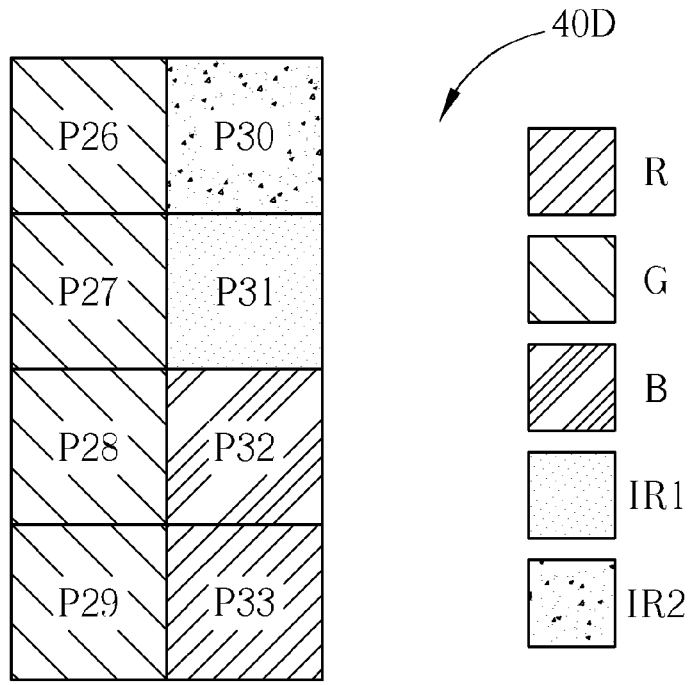

Further, the filter pattern 40C shown in FIG. 4C comprises pixels P18-P25, wherein the pixels P18-P21 are corresponding to the green G and the pixels P22-P25 are respectively corresponding to the infrared IR1, the blue B, the infrared IR2 and the red R. Please refer to FIG. 4D, the filter pattern 40D comprises pixels P26-P33. Similar to the filter pattern 40C shown in FIG. 4C, the pixels P26-P29, which is located at the left side, are corresponding to the green G and the pixel P33, which is located at the right bottom corner, is corresponding to the red R. Different from the filter pattern 40C, the pixels P30-P32, which are located at the right side of the filter pattern 40D shown in FIG. 4D, are changed to be corresponding to the infrared IR2, the infrared IR1 and the blue B.

Figure 4E:
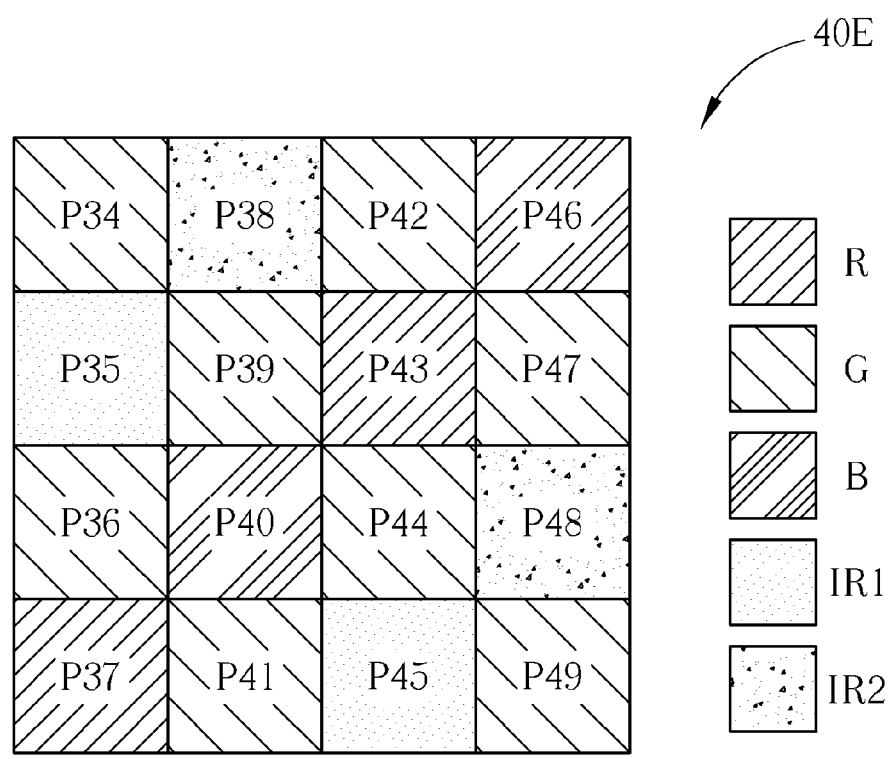
Figure 4F:
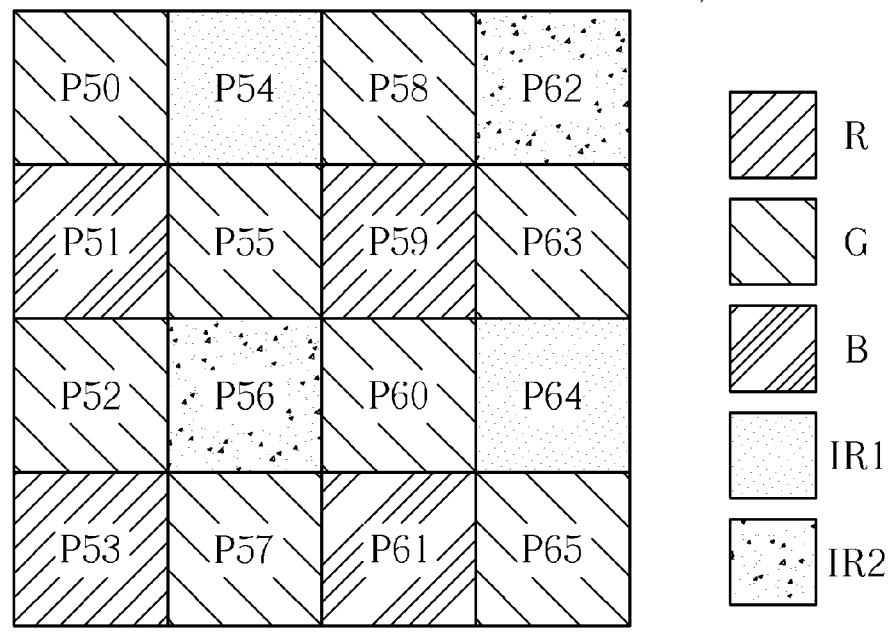

The filter pattern 40E shown in FIG. 4E comprises pixels P34-P49. The pixels P34, P36, P39, P41, P42, P44, P47 and P49 are corresponding to the green G; the pixels P35 and P45 are corresponding to the infrared IR1; the pixels P37 and P43 are corresponding to the red R; the pixels P38 and P48 are corresponding to the infrared IR2; and the pixels P40 and P46 are corresponding to the blue B. Please refer to FIG. 4F, the filter pattern 40F comprises pixels P50-P65. The pixels P50, P52, P55, P57, P58, P60, P63 and P65 are corresponding to the green G; the pixels P54 and P64 are corresponding to the infrared IR1; the pixels P53 and P59 are corresponding to the red R; the pixels P56 and P62 are corresponding to the infrared IR2; and the pixels P51 and P61 are corresponding to the blue B. The detailed operation principles of the filter patterns 40A-40F can be referred to the above, and are not narrated herein for brevity.

Figure 5:
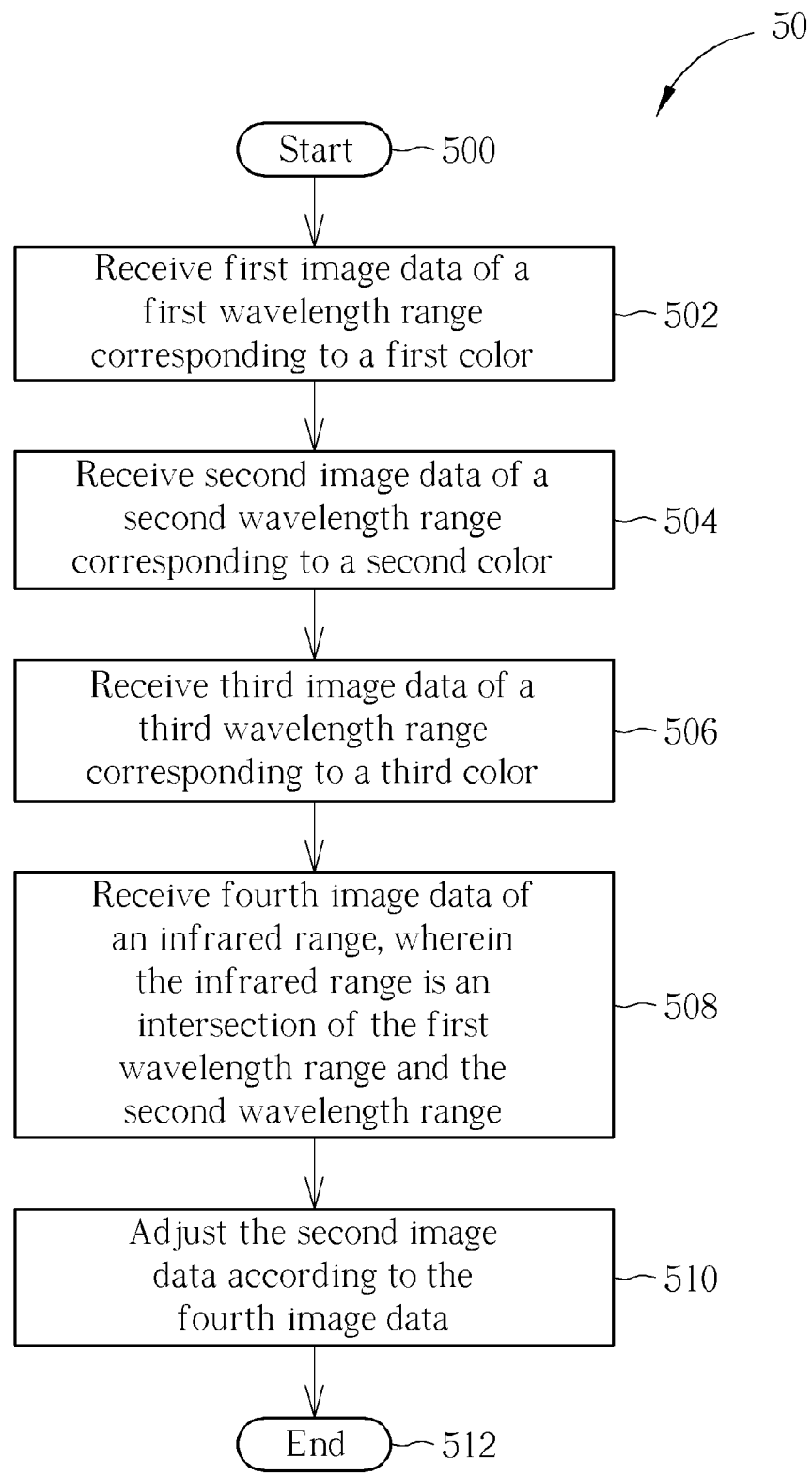
FIG. 5 is a flowchart of an image receiving method according to an embodiment of the present invention.

The process of the image sensing device of the above embodiment receives the images can be summarized into an image receiving method 50, as shown in FIG. 5. The image receiving method 50 may be utilized in an image sensing device or the electronic products equipped the function of image sensing (e.g. a digital camera) and comprise the following steps:

Step 500: Start.
Step 502: Receive first image data of a first wavelength range corresponding to a first color.
Step 504: Receive second image data of a second wavelength range corresponding to a second color.
Step 506: Receive third image data of a third wavelength range corresponding to a third color.
Step 508: Receive fourth image data of an infrared range, wherein the infrared range is an intersection of the first wavelength range and the second wavelength range.
Step 510: Adjust the second image data according to the fourth image data.
Step 512: End.

According to the image receiving method 50, after the image sensing device receives first image data of a first color, second image data of a second color and third image data of a third color, the image sensing device further receives fourth image data corresponding to the first color and the second color. Next, the image sensing device adjusts the second image data according to the fourth image data, to eliminate unnecessary infrared information in the second image data. The detail operation principles of the image receiving method 50 can be referred to the above and is not described herein for brevity.

Figure 6:
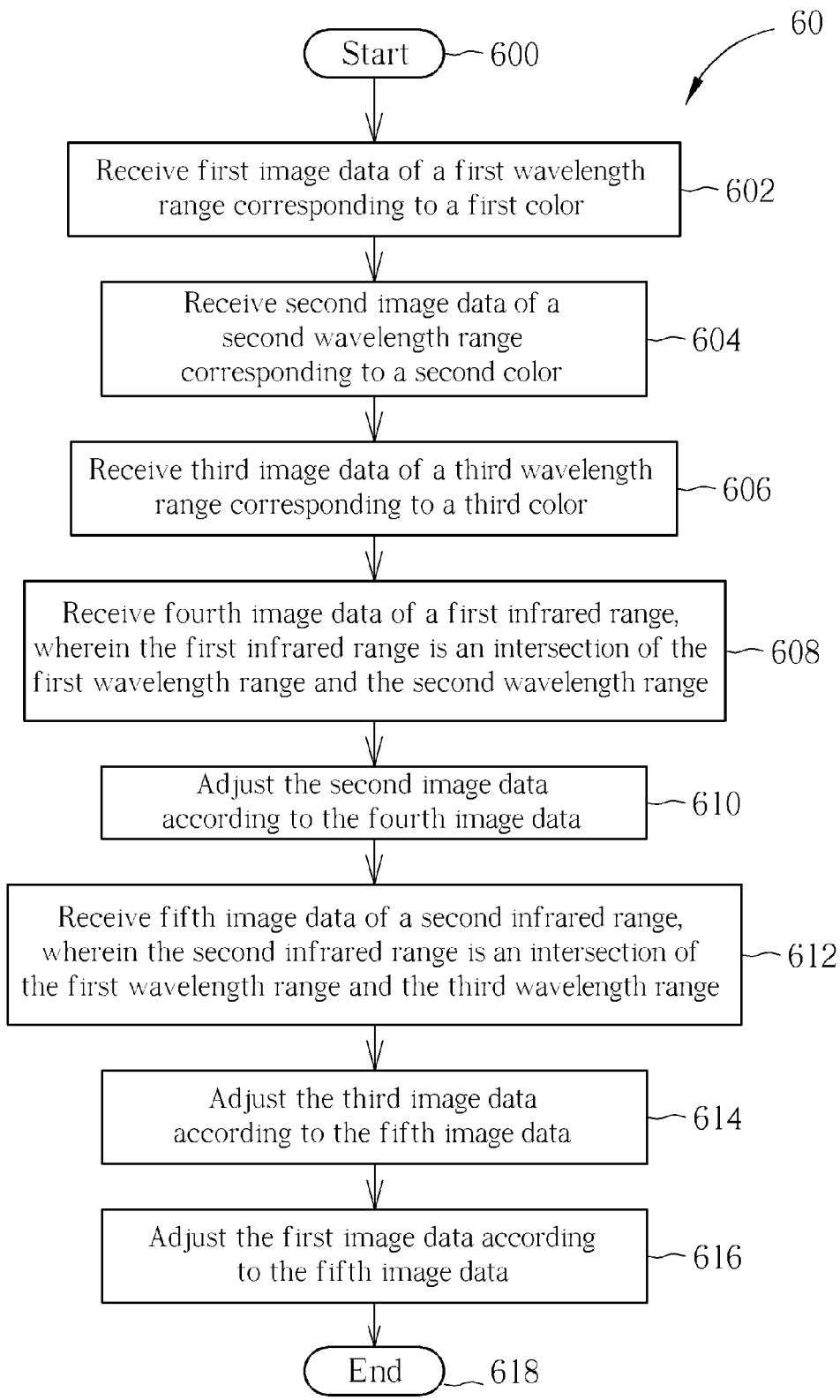
FIG. 6 is a flowchart of another image receiving method according to an embodiment of the present invention.

Further, the process of the image sensing device of the above embodiment receives the images can be summarized into another image receiving method 60, as shown in FIG. 6. The image receiving method 60 may be utilized in an image sensing device or the electronic products equipped the function of image sensing (e.g. a digital camera) and comprise the following steps:

Step 600: Start.
Step 602: Receive first image data of a first wavelength range corresponding to a first color.
Step 604: Receive second image data of a second wavelength range corresponding to a second color.
Step 606: Receive third image data of a third wavelength range corresponding to a third color.
Step 608: Receive fourth image data of a first infrared range, wherein the first infrared range is an intersection of the first wavelength range and the second wavelength range.
Step 610: Adjust the second image data according to the fourth image data.
Step 612: Receive fifth image data of a second infrared range, wherein the second infrared range is an intersection of the first wavelength range and the third wavelength range.
Step 614: Adjust the third image data according to the fifth image data.
Step 616: Adjust the first image data according to the fifth image data.
Step 618: End.

According to the image receiving method 60, after the image sensing device receives first image data of a first color, second image data of a second color and third image data of a third color, the image sensing device further receives fourth image data corresponding to the first color and the second color and fifth image data corresponding to the first color and the third color. Next, the image sensing device adjusts the second image data according to the fourth image data, to eliminate unnecessary infrared element in the second image data. Similarly, the image sensing device adjusts the first image data and the third image data according to the fifth image data, to remove unnecessary infrared element in the first image data and the third image data. The detail operation principles of the image receiving method 60 can be referred to the above and is not narrated herein for brevity.

To sum up, the image sensing device acquires the image data of different wavelength ranges via the color filter array consisted of filter patterns in the above embodiments. According to the acquired image data, the image sensing device removes the infrared elements in the image data to obtain the accurate color information. In other words, the image sensing device achieves the goal of eliminating the infrared element in the image data without using the infrared cut filter, to allow the color information of the image data captured by the image sensing device to become closer to the true colors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A color filter array, for an image sensing device, the color filter array comprising a plurality of filter patterns, wherein each filter pattern comprises:
    at least one first filter, corresponding to a first wavelength range of a first color;
    at least one second filter, corresponding to a second wavelength range of a second color;
    at least one third filter, corresponding to a third wavelength range of a third color;
    at least one fourth filter, corresponding to a first infrared wavelength range, wherein the first infrared wavelength range is an intersection of the first wavelength range and the second wavelength range; and
    at least one fifth filter, corresponding to a second infrared wavelength range, wherein the second infrared wavelength range is an intersection of the first wavelength range and the third wavelength range;
    wherein the at least one second filter comprises the second filter located at a first row and a first column and the second filter located at a second row adjacent to the first row and the first column; the at least one fourth filter comprises the fourth filter located at the first row and a second column adjacent to the first column; the at least one fifth filter comprises the fifth filter located at the second row and the second column; the at least one third filter comprises the third filter located at the first row and a third column adjacent to the second column; and the at least one first filter comprises the first filter located at the second row and the third column.

2. The color filter array of claim 1, wherein the first color is red, the second color is green and the third color is blue.

3. The color filter array of claim 1, wherein each of the at least one fourth filter is realized by the first filter and the second filter.

4. The color filter array of claim 1, wherein each of the at least one fifth filter is realized by the first filter and the third filter.

5. An image receiving method, for an image sensing device, the image receiving method comprising:
    receiving first image data of a first wavelength range corresponding to a first color;
    receiving second image data of a second wavelength range corresponding to a second color;
    receiving third image data of a third wavelength range corresponding to a third color;
    receiving fourth image data of a first infrared range, wherein the first infrared range is an intersection of the first wavelength range and the second wavelength range;
    adjusting the second image data according to the fourth image data;
    receiving fifth image data of a second infrared range, wherein the second infrared range is an intersection of the first wavelength range and the third wavelength range; and
    adjusting the first image data and the third image data according to the fifth image data;
    wherein the first color is red, the second color is green and the third color is blue.

6. A color filter array, for an image sensing device, the color filter array comprising a plurality of filter patterns, wherein each filter pattern comprises:
    at least one first filter, corresponding to a first wavelength range of a first color;
    at least one second filter, corresponding to a second wavelength range of a second color;
    at least one third filter, corresponding to a third wavelength range of a third color;
    at least one fourth filter, corresponding to a first infrared wavelength range, wherein the first infrared wavelength range is an intersection of the first wavelength range and the second wavelength range; and
    at least one fifth filter, corresponding to a second infrared wavelength range, wherein the second infrared wavelength range is an intersection of the first wavelength range and the third wavelength range;
    wherein the at least one second filter comprises the second filter located at a first row and a first column and the second filter located at a second row adjacent to the first row and a third column; the at least one fourth filter comprises the fourth filter located at the first row and a second column between the first column and the third column; the at least one fifth filter comprises the fifth filter located at the second row and the first column; the at least one third filter comprises the third filter located at the first row and the third column; and the at least one first filter comprises the first filter located at the second row and the second column.

7. A color filter array, for an image sensing device, the color filter array comprising a plurality of filter patterns, wherein each filter pattern comprises:
    at least one first filter, corresponding to a first wavelength range of a first color;
    at least one second filter, corresponding to a second wavelength range of a second color;
    at least one third filter, corresponding to a third wavelength range of a third color;
    at least one fourth filter, corresponding to a first infrared wavelength range, wherein the first infrared wavelength range is an intersection of the first wavelength range and the second wavelength range; and
    at least one fifth filter, corresponding to a second infrared wavelength range, wherein the second infrared wavelength range is an intersection of the first wavelength range and the third wavelength range;

wherein the at least one second filter comprises the second filter located at a first row and a first column, the second filter located at a second row adjacent to the first row and the first column, the second filter located at a third row adjacent to the second row and the first column, and the second filter located at a fourth row adjacent to the third row and the first column; the at least one fourth filter comprises the fourth filter located at the first row and a second column adjacent to the first column; the at least one fifth filter comprises the fifth filter located at the third row and the second column; the at least one third filter comprises the third filter located at the second row and the second column; and the at least one first filter comprises the first filter located at the fourth row and the second column.

8. A color filter array, for an image sensing device, the color filter array comprising a plurality of filter patterns, wherein each filter pattern comprises:
- at least one first filter, corresponding to a first wavelength range of a first color;
- at least one second filter, corresponding to a second wavelength range of a second color;
- at least one third filter, corresponding to a third wavelength range of a third color;
- at least one fourth filter, corresponding to a first infrared wavelength range, wherein the first infrared wavelength range is an intersection of the first wavelength range and the second wavelength range; and
- at least one fifth filter, corresponding to a second infrared wavelength range, wherein the second infrared wavelength range is an intersection of the first wavelength range and the third wavelength range;
- wherein the at least one second filter comprises the second filter located at a first row and a first column, the second filter located at a second row adjacent to the first row and the first column, the second filter located at a third row adjacent to the second row and the first column, and the second filter located at a fourth row adjacent to the third row and the first column; the at least one fourth filter comprises the fourth filter located at the second row and a second column adjacent to the first column; the at least one fifth filter comprises the fifth filter located at the first row and the second column; the at least one third filter comprises the third filter locate at the third row and the second column; and the first filter comprises the first filter located at the fourth row and the second column.

9. A color filter array, for an image sensing device, the color filter array comprising a plurality of filter patterns, wherein each filter pattern comprises:
- at least one first filter, corresponding to a first wavelength range of a first color;
- at least one second filter, corresponding to a second wavelength range of a second color;
- at least one third filter, corresponding to a third wavelength range of a third color;
- at least one fourth filter, corresponding to a first infrared wavelength range, wherein the first infrared wavelength range is an intersection of the first wavelength range and the second wavelength range; and
- at least one fifth filter, corresponding to a second infrared wavelength range, wherein the second infrared wavelength range is an intersection of the first wavelength range and the third wavelength range;
- wherein the at least one second filter comprises the second filter located at a first row and a first column, the second filter located at a second row adjacent to the first row and a second column adjacent to the first column, the second filter locate at the first row and a third column adjacent to the second column, and the second filter located at the second row and a fourth column adjacent to the third column; the at least one fourth filter comprises the fourth filter locate at the second row and the first column; the at least one fifth filter comprises the fifth filter located at the first row and the second column; the at least one third filter comprises the third filter located at the first row and the fourth column; and the at least one first filter comprises the first filter located at the second row and the third column.

10. A color filter array, for an image sensing device, the color filter array comprising a plurality of filter patterns, wherein each filter pattern comprises:
- at least one first filter, corresponding to a first wavelength range of a first color;
- at least one second filter, corresponding to a second wavelength range of a second color;
- at least one third filter, corresponding to a third wavelength range of a third color;
- at least one fourth filter, corresponding to a first infrared wavelength range, wherein the first infrared wavelength range is an intersection of the first wavelength range and the second wavelength range; and
- at least one fifth filter, corresponding to a second infrared wavelength range, wherein the second infrared wavelength range is an intersection of the first wavelength range and the third wavelength range;
- wherein the at least one second filter comprises the second filter located at a first row and a first column, the second filter located at a second row adjacent to the first row and a second column adjacent to the first column, the second filter located at the first row and a third column adjacent to the second column, and the second filter located at the second row and a fourth column adjacent to the third column; the at least one fourth filter comprises the fourth filter located at the first row and the second column; the at least one fifth filter comprises the fifth filter located at the first row and the fourth column; the at least one third filter comprises the third filter located at the second row and the first column; and the at least one first filter comprises the first filter located at the second row and the third column.

* * * * *